United States Patent
Muhtaroglu et al.

(10) Patent No.: US 11,239,795 B2
(45) Date of Patent: Feb. 1, 2022

(54) FULLY INTEGRATED OSCILLATOR FOR ULTRA LOW VOLTAGE APPLICATIONS WITH QUADRUPLED VOLTAGE AND LOW PHASE NOISE

(71) Applicant: ORTA DOGU TEKNIK UNIVERSITESI, Ankara (TR)

(72) Inventors: Ali Muhtaroglu, Guzelyurt (CY); Jayaweera Herath, Guzelyurt (CY)

(73) Assignee: ORTA DOGU TEKNIK UNIVERSITESI, Ankara (TR)

(*) Notice: Subject to any disclaimer, the term of this patent is extended or adjusted under 35 U.S.C. 154(b) by 0 days.

(21) Appl. No.: 17/251,231

(22) PCT Filed: Jun. 10, 2019

(86) PCT No.: PCT/TR2019/050424
§ 371 (c)(1),
(2) Date: Dec. 11, 2020

(87) PCT Pub. No.: WO2020/036560
PCT Pub. Date: Feb. 20, 2020

(65) Prior Publication Data
US 2021/0265948 A1 Aug. 26, 2021

(30) Foreign Application Priority Data
Jun. 14, 2018 (TR) .............................. 2018/08532

(51) Int. Cl.
*H03B 5/12* (2006.01)
(52) U.S. Cl.
CPC .......... *H03B 5/1228* (2013.01); *H03B 5/124* (2013.01); *H03B 5/1212* (2013.01); *H03B 2200/009* (2013.01)

(58) Field of Classification Search
CPC .................................................. H03B 5/1228
USPC ..................................................... 331/117 FE
See application file for complete search history.

(56) References Cited

U.S. PATENT DOCUMENTS

| | | |
|---|---|---|
| 6,469,586 B1 | 10/2002 | Rogers et al. |
| 6,680,657 B2 | 1/2004 | Wang et al. |
| 7,075,379 B2 | 7/2006 | Rana et al. |
| 7,180,381 B2 | 2/2007 | Rohde et al. |
| 7,256,660 B2 | 8/2007 | Gelhausen et al. |

(Continued)

FOREIGN PATENT DOCUMENTS

| | | |
|---|---|---|
| EP | 3319229 A2 | 5/2018 |
| WO | 2016054612 A1 | 4/2016 |

OTHER PUBLICATIONS

Kachun Kwok et al., Ultra-Low-Voltage High-Performance CMOS VCOs Using Transformer Feedback, IEEE Journal of Solid-State Circuits, Mar. 2005, pp. 652-660, vol. 40, No. 3.

(Continued)

*Primary Examiner* — Joseph Chang
(74) *Attorney, Agent, or Firm* — Bayramoglu Law Offices LLC (57) ABSTRACT

A self-operating oscillator which increases an input DC voltage by a coefficient factor of 4 or more is provided. The self-operating oscillator includes a primary LC tank pair, a secondary LC tank pair, and a switch pair. The primary and the secondary LC tank provide a differential sinusoidal output voltage which corresponds to high amplitude, low phase noise and high purity.

14 Claims, 4 Drawing Sheets

(56) References Cited

U.S. PATENT DOCUMENTS

| | | | |
|---|---|---|---|
| 8,018,292 B2* | 9/2011 | Wachi | H03B 5/1212 331/117 R |
| 8,212,625 B2 | 7/2012 | Lee et al. | |
| 9,214,895 B2 | 12/2015 | Shanan | |
| 2013/0063218 A1 | 3/2013 | Sadhu et al. | |
| 2015/0031313 A1* | 1/2015 | Murphy | H03B 5/1228 455/77 |

OTHER PUBLICATIONS

BooN-Eu Seow et al., A Low-Voltage 30-GHz CMOS Divide-by-Three ILFD With Injection-Switched Cross-Coupled Pair Technique, IEEE Transactions on Microwave Theory and Techiques, May 2017, pp. 1560-1568, vol. 65, No. 5.

Marc Tiebout, Low-Power Low-Phase-Noise Differentially Tuned Quadrature VCO Design in Standard CMOS, IEEE Journal of Solid-State Circuits, Jul. 2001, pp. 1018-1024, vol. 36, No. 7.

Wen-Cheng Lai et al., Low Power Consumptions Voltage Control Oscillator Uses PMOS Elements Optical Sensor Application, 15th International Conference on Optical Communications and Networks (ICOCN), 2016, pp. 1-4.

Sheng-Lyang Jang et al., A Dual-Band CMOS Voltage-Controlled Oscillator Implemented With Dual-Resonance LC Tank, IEEE Microwave and Wireless Components Letters, Dec. 2009, pp. 816-818, vol. 19, No. 12.

Sho Ikeda et al., A 0.5 V 5.96-GHz PLL With Amplitude-Regulated Current-Reuse VCO, IEEE Microwave and Wireless Components Letters, 2017, pp. 1-3, vol. 27, No. 3.

Huijung Kim et al., A Low Phase-Noise CMOS VCO With Harmonic Tuned LC Tank, IEEE Transactions on Microwave Theory and Techniques, Jul. 2006, pp. 2917-2924, vol. 54, No. 7.

Hsieh-Hung Hsieh et al., A High-Performance CMOS Voltage-Controlled Oscillator for Ultra-Low-Voltage Operations, IEEE Transactions on Microwave Theory and Techniques, Mar. 2007, pp. 467-473, vol. 55, No. 3.

Ho-Jun Chang et al., CMOS QVCO With Current-Reuse, Bottom-Series Coupling, and Forward Body Biasing Techniques, IEEE Microwave and Wireless Components Letters, Sep. 2014, pp. 608-610, vol. 24, No. 9.

L. Geynet et al., Fully-Integrated Multi-Standard VCOs with switched LC tank and Power Controlled by Body Voltage in 130nm CMOS/SOI, IEEE Radio Frequency Integrated Circuits (RFIC) Symposium, 2006, pp. 1-4.

Ki-Won Kim et al., A 5.8 GHz Low-Phase-Noise LC-QVCO Using Splitting Switched Biasing Technique, IEEE Microwave and Wireless Components Letters, Jun. 2010, pp. 337-339, vol. 20, No. 6.

Aya G. Amer et al., A 1-mW 12-GHz LC VCO in 65-nm CMOS Technology, IEEE International Conference on Electronics, Circuits and Systems (ICECS), 2016, pp. 456-459.

M. Jalalifar et al., Design of Ku-band transformer-based cross-coupled complementary LC-VCO, Electronics Letters, May 2015, pp. 832-834, vol. 51, No. 11.

Hua-Lin Cai et al., A 2.7-mW 1.36-1.86-GHz LC-VCO With a FOM of 202 dBc/Hz Enabled by a 26%-Size-Reduced Nano-Particle-Magnetic-Enhanced Inductor, IEEE Transaction on Microwave Theory and Techiques, May 2014, pp. 1221-1228, vol. 62, No. 5.

H.M.P.C. Jayaweera et al., Fully Integrated Ultra-Low Voltage Step-up Converter with Voltage Doubling LC-Tank for Energy Harvesting Applications, Journal of Physics: Conference Series, 2015, pp. 1-5, vol. 660, No. 1.

\* cited by examiner

FULLY INTEGRATED OSCILLATOR FOR ULTRA LOW VOLTAGE APPLICATIONS WITH QUADRUPLED VOLTAGE AND LOW PHASE NOISE

CROSS REFERENCE TO THE RELATED APPLICATIONS

This application is the national phase entry of International Application No. PCT/TR2019/050424, filed on Jun. 10, 2019, which is based upon and claims priority to Turkish Patent Application No. 2018/08532, filed on Jun. 14, 2018, the entire contents of which are incorporated herein by reference.

TECHNICAL FIELD

The present invention is related to a self-starting oscillator which increases DC (Direct Current) voltage with a coefficient factor of 4 or more, by using a primary and a secondary LC tank in order to provide a differential sinusoidal output voltage which corresponds to high amplitude, low phase noise and high purity. The circuit design described in the present invention is suitable for ultra-low voltage applications together with particularly low cost and high integration.

BACKGROUND

Oscillators are key components used to establish periodic signals as in for example clocks used in synchronous digital systems, in carrier signals for communication and in charge pump stimulators in DC-DC converters. LC tank oscillators have been used in various applications due to their outstanding performance in terms of minimum operation voltage, self-operation ability, low phase noise and high output voltage amplitude. However, the performance of the LC tank is dependent actually on the inductor quality factor and the ability to compensate real losses in a single cycle. Inductors integrated to the chip typically have high resistance and low quality factor. These inductive real losses are compensated with negative resistance created from active devices such as cross connected NMOS pairs. The active devices contribute to the increase in phase noise shown in the Leeson equation 1 together with the extra resistance added to the system and the lowered oscillation amplitude. Therefore, high profit, integrated low cost oscillators relating to low voltage and low power applications are key obligations for the integrated device market.

In the recent years several circuit inventions have been provided which address the problems related to integrated LC tank voltage controlled oscillator (VCO) topologies relating to low power applications with low voltage levels. The transformer return VCO, has been provided with the reference number [1] in order to increase performance in terms of oscillation purity and voltage amplitude. However, the applied tank capacitor has led to distortions in oscillation amplitude and the inductive coupling mechanism has limited minimum operation voltage. In the reference with the number [2] the application of the medium level cross transformer coupling provides good phase noise and power consumption, however, it reduces voltage gain. The references numbered [3], [4] and [5] published in the recent years provide low power VCO design together with a 1 V input. However, the applied additional active devices (MOSFET's—Metal Oxide Semi Conductor Field Effect Transistors) increase phase noise and reduce oscillation purity. The double resonance LC tank set forth by the reference number [6] has double band switching ability with the mutual LC tank having a 0.8 V input, however, the phase noise is significantly high even in the double digit frequency range. The reference numbered [7] provides the method of re-using the current in order to improve the power consumption of the VCO. However, the voltage gain in such an order due to the amplitude imbalances of differential outputs is limited with the unit. The asymmetrical structure of the VCO increases phase noise up to −98 dBc/Hz at 1 Mhz frequency and 5.96 GHz. The harmonic tuned LC tank provided by the reference number [8], has low phase noise at 2 GHz, but offers less than 2× amplitude gain and poor oscillation purity. The NMOS differential oscillator which has two inductors presented with the reference number [9] has low phase noise and low jitter due to the symmetry of the oscillator, however, the amplitude gain is less than two folds. The low voltage VCO topology provided by the reference number [10] has weak performance during an ultra low voltage operation due to the number of the active components such as diodes, resistances and transistors. The voltage adjustable LC tank set forth with the reference number [11] has better phase noise than −137 dBc/Hz for the 400 to 1300 MHz frequency band, and has an offset of 100 kHz at 5 V input. As the current at the 5 V input is limited with 15 mA, this design suffers from low current drive. The PMOS cross connected LC tank set forth by the reference number [12] is suitable for low power applications due to its low power consumption and low phase noise, however, the oscillator has insufficient charge drive and unity gain. Therefore, the design does not provide a solution relating to ultra low voltage applications together with the input voltage under threshold voltage of the CMOS (Complementary Metal-Oxide-Semiconductor) technology. The most frequently proposed LC tank VCO's suffer from oscillation purity and output voltage oscillation, and degraded phase noise due to the number of active components in the VCO and the input voltage limitation.

The application of a secondary LC tank as a booster element for the primary LC tank has been suggested in the reference numbered [13] in order to reduce phase noise. However, the six MOSFET's used has increased phase noise and it has limited this noise to ≥−150 dBc/Hz at a 1 MHz offset. The cross connected PMOS pair as referred to in number [13] reduces oscillation while it limits the load current and minimum operation voltage. Additionally, the cost is inherently higher in the reference numbered [13] in comparison to the present invention due to higher number of components.

Forward body bias technique has been disclosed in the reference numbers [14], [15] and [16] together with capacitive feedback, current reuse with bottom series coupling, and core current control respectively, to improve the LC tank performance in terms of amplitude gain, phase noise and low power consumption at low voltage operation. Despite the filtering techniques presented in the reference number [17] in order to increase phase noise performance, additional MOSFET's contribute to power loss and reduce voltage gain. Most of the circuits described above oscillate with a minimum frequency range of several Ghz. On the other hand, a fully integrated, low cost, self-starting oscillator design with low supply voltage range is required for MHz frequency applications, such as short wave data communication, DC-DC converter design, etc. In addition, body biasing techniques increase the design and fabrication cost significantly for conventional CMOS processes.

The problems that have been defined above are eliminated by means of the invention.

SUMMARY

The invention is related to a fully integrated, oscillator for ultra low voltage applications which quadruples voltage and has low phase noise.

The fully integrated, oscillator for ultra low voltage applications which quadruples voltage and has low phase noise according to the present invention aims to provide the following;
- increasing the output voltage amplitude via the secondary LC tank,
- increasing the output power capacity via the secondary LC tank,
- reducing phase noise via the secondary LC tank,
- self-starting oscillator signals with different amplitude, duty cycle and frequency,
- contributing to the correct switching mechanism of the oscillator in order to improve oscillation purity and phase noise,
- comprising the secondary LC tank output used as the NMOS switching gate voltage in order to control the operation of the oscillator,
- comprising high voltage switching controls,
- providing completely switched off N-channel MOSFET's via the negative peak point of the secondary LC tank,
- decreasing the leakage to improve the oscillation performance and power dissipation by the negative peak of the secondary LC tank,
- using the secondary LC tank output as the oscillator output,
- being formed of the oscillator that has low phase noise and good oscillation purity.

According to an aspect of the present invention the invention comprises a primary LC tank that is serially connected to the secondary LC tank at the peak amplitude of the LC tank output node which quadruples voltage.

According to another aspect the invention comprises a cross connected N-channel MOSFET (NMOS) pair as a negative resistance generator.

According to another aspect the invention comprises a cross connected switching pair characterized by a control pair in relation to two LC oscillators (primary and secondary) that operate synchronously.

According to another aspect the present invention comprises a secondary LC tank which quadruples (4×) output amplitude voltage in comparison to the input voltage amplitude, increases output power capacity and reduces phase noise; the said secondary LC tank's output is used as NMOS switch gate voltage to control the oscillator operation and the oscillator's output is generated by the secondary LC tank's output and the secondary LC tank cooperates with a primary LC tank, the secondary LC tank of voltage quadrupling LC tank is formed between the gate of the one NMOS and the drain of the other NMOS, the secondary LC tank's output has full sine wave oscillations, while the primary LC tank has half wave oscillations due to the ground connected NMOS, the secondary LC tank is form of the parallel combination of the $C_2$ capacitor with $L_2$ inductor.

Another aspect of the present invention comprises a high voltage switching control characterized by completely turning off the NMOS by using the negative peak point of the secondary LC tank and reducing leakage in order to reduce power losses and improve oscillation performance.

Another aspect of the invention comprises an LC tank pair characterized by having at least two active components which are two N-channel MOSFET's.

Another aspect of the invention comprises a secondary LC tank pair characterized by having at least 4 passive components which are two inductors and two capacitors.

Another aspect of the invention comprises a primary LC tank pair characterized by having at least 2 passive components which are two inductors.

Another aspect of the present invention comprises an LC tank characterized by having an LC tank output connected to the active NMOS device gate terminal which quadruples voltage.

Another aspect of the present invention comprises an LC tank characterized by having an LC tank which quadruples voltage having the ability to form a pair of differential (180° phase deviation) signals having <1 GHz oscillation.

Another aspect of the present invention includes LC tank characterized by the primary and the secondary oscillators of the voltage quadrupling LC tank that are in series once the corresponding MOSFET is switched off.

Another aspect of the present invention comprises an LC tank characterized by having a only one power supply from the system input.

Another aspect of the invention comprises two optional $C_1$ capacitors as a part of the primary LC tank pair which can be replaced with the parasitic capacitance of inductors and switches in integrated designs as a $C_0$.

Another aspect of the invention comprises an optional $C_0$ bypass capacitor located between the right side and left side LC tanks in the LC tank pair.

Another aspect of the invention comprises N-channel MOSFETs characterized by having two N-channel MOSFET (NMOS) in the oscillator.

Yet another aspect of the invention comprises an LC tank characterized by the implemetation of the LC tank in the 180 nm CMOS technology which can operate automatically with a low input voltage as low as 0.09 V in order to sustain oscillations with an amplitude of 0.36 V.

BRIEF DESCRIPTION OF THE DRAWINGS

The figures have been used in order to further disclose the oscillator developed by the present invention which has low phase noise and which quadruples voltage and which is fully integrated for ultra low voltage applications and the figures have been described below.

DETAILED DESCRIPTION OF THE EMBODIMENTS

Fully Integrated voltage quadrupling and low phase noise oscillator for ultra low voltage applications developed with this invention consists of a novel oscillator circuit design which produces a sinusoidal signal output with at least quadrupled peak-to-peak amplitude compared to the input DC voltage supply.

Various terms to better describe the fully integrated oscillator for ultra low voltage applications which quadruples voltage and has low phase noise have been presented and disclosed below.

Terminology:
C: Capacitor
L: Inductor
$C_0$: Optional bypass capacitor
$C_1$: Primary capacitor
$C_2$: Secondary capacitor
$L_1$: Primary inductor
$L_2$: Secondary inductor
NMOS: N-channel MOSFET's
$V_{DD}$: Positive supply voltage (input source)
CLK1: oscillator output node 1
CLK2: oscillator output node 2
N1: The first of the N-channel MOSFET pair
N2: The second of the N-channel MOSFET pair
$C_L$: Load capacitor (C-load)
$R_L$: Load resistance parallel with the load capacitor (R-load)
LC: (Inductor-Capacitor) formed of an inductor and capacitor The present invention has been described in detail below.

The fully integrated oscillator developed by the present invention for ultra low voltage applications which quadruples voltage and has low phase noise is formed of an oscillator. The oscillator, comprises an LC tank comprising a primary LC tank and a secondary LC tank, a cross connected switch pair which can be implemented with a pair of N-channel MOSFET's (NMOS), and self-generated signals having different duty cycles and a high voltage switch control.

Figure 1:
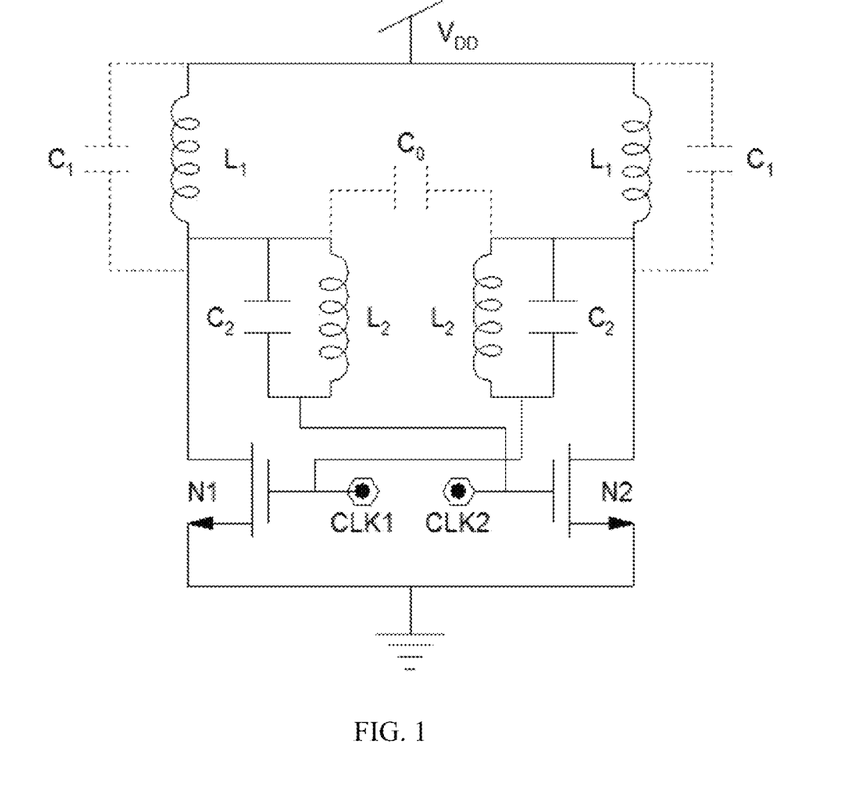
FIG. 1 shows the LC tank based oscillator which quadruples the voltage.

The oscillator has desirable characteristic features such as low phase noise and frequency stability in addition to high output voltage amplitude. Therefore, the aim of the invention is reached by means of the two LC oscillators (primary and secondary) which operate in synchronization with each other and which are controlled by a pair of cross connected switch pairs. As shown in FIG. 1, the control switches can be used with N-channel MOSFET's (NMOS). The input ($V_{DD}$) in FIG. 1 is the input supply voltage. (CLK1) and (CLK2) represent two output sinusoidal signals having 180° phase offset relative to each other. The negative resistance of the cross connected differential NMOS pair, compensate the real losses received from passive components. $C_0$ is an optional bypass capacitor to modify the amplitude and frequency characteristics of the primary oscillator. The capacitor ($C_1$) of the primary oscillator can be replaced with the parasitic capacitance of inductors and switches in integrated designs and it does not have to be an explicit capacitor. The parallel combination of $C_2$ with $L_2$ forms the secondary LC tank.

Figure 2A:
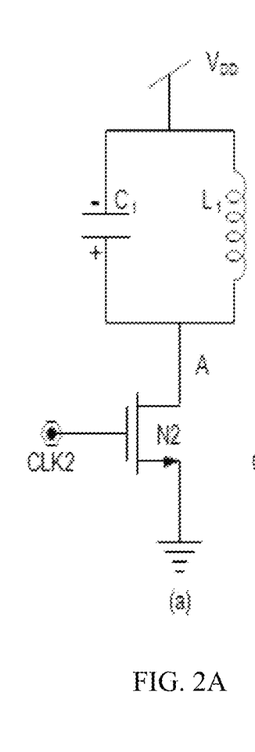
FIGS. 2A-2E each shows a half circuit analysis of the primary oscillator.
Figures 2B, 2C, 2D:
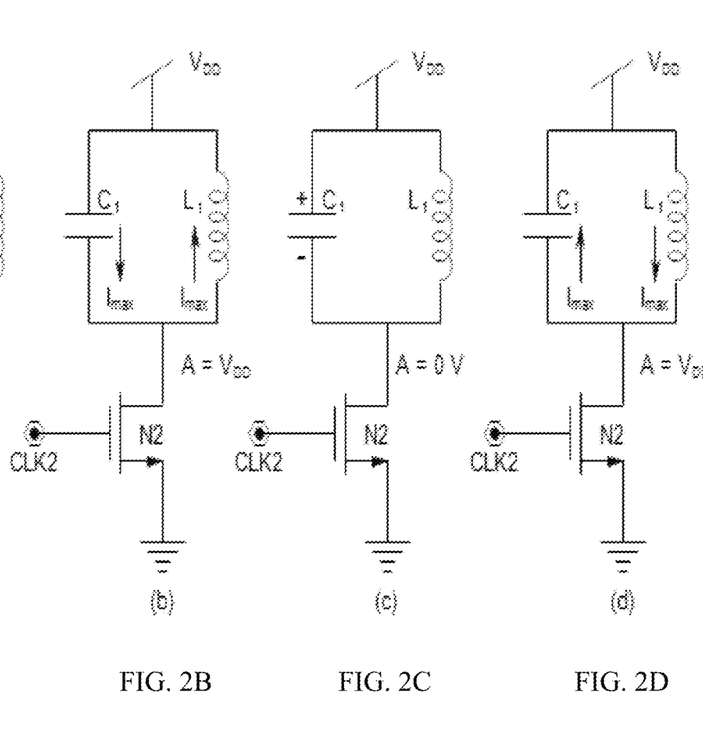
Figure 2E:
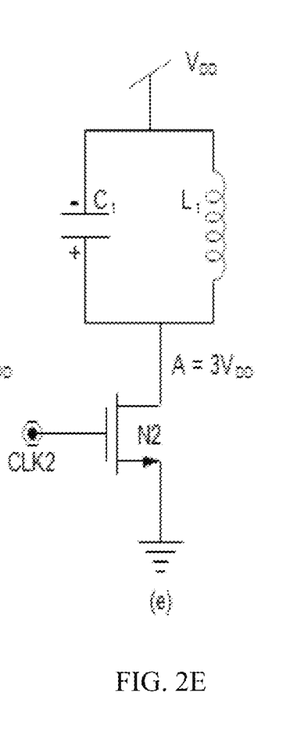
Figure 3A:
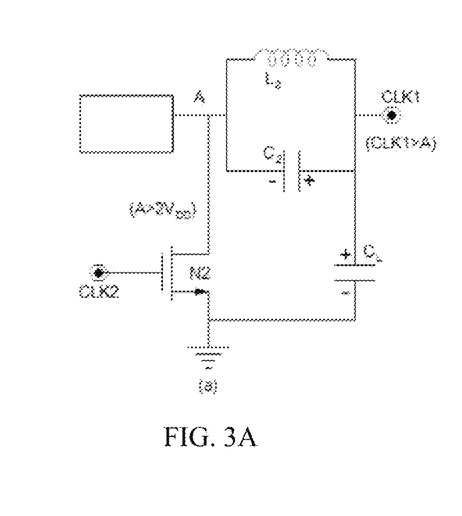
FIGS. 3A-3F each shows a half circuit analysis of the secondary oscillator.
Figure 3B:
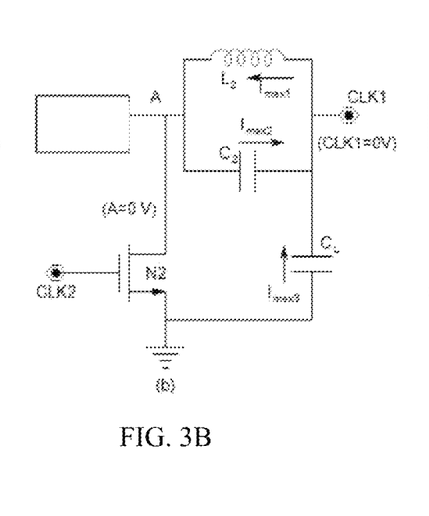
Figure 3C:
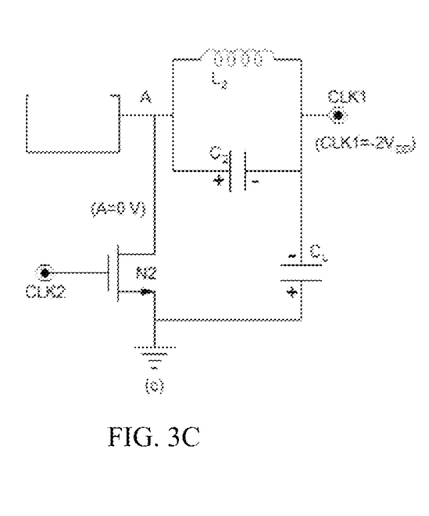
Figure 3D:
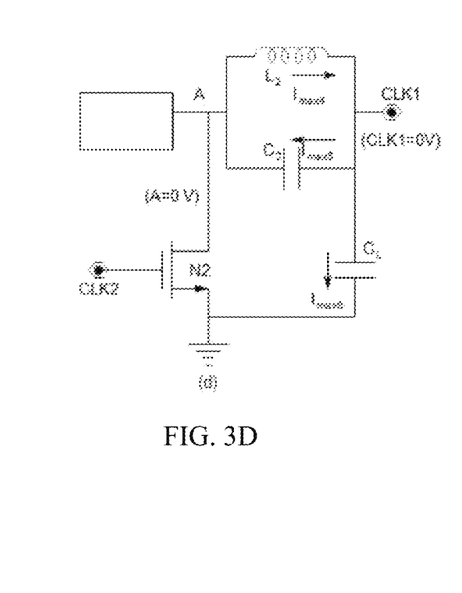
Figure 3E:
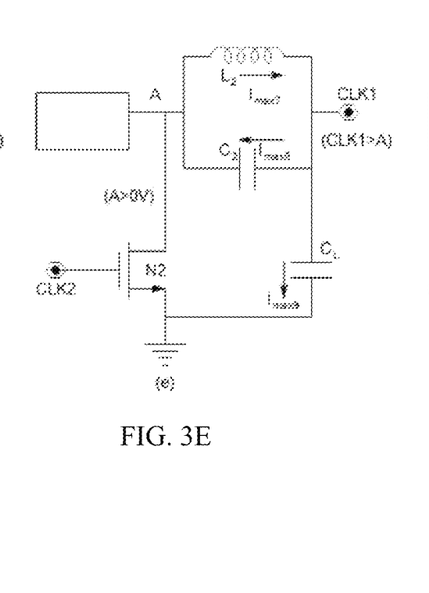
Figure 3F:
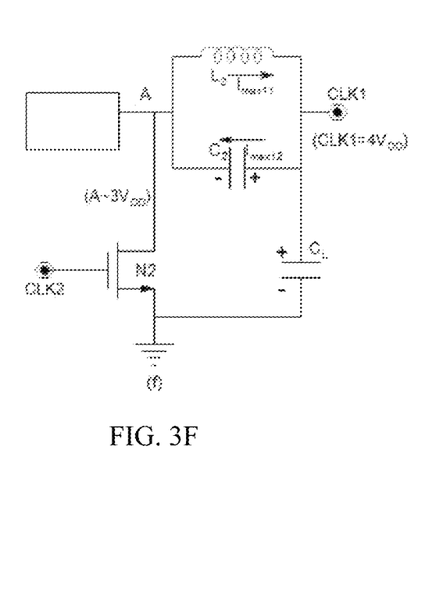

A detailed description of an invention is presented with model based circuit analysis. The basic working mechanism of the primary LC tank is analyzed through FIG. 2A-2E. A capacitor stores energy in the form of electrical charge, which generates a voltage across it. An inductor stores energy in its magnetic field, depending on the current through it. The inductor peak current with fully discharged $C_1$ capacitor leads to convey input voltage ($V_{DD}$) to node A in FIGS. 2A-2E. If N2 is off and $C_1$ is fully charged as shown in FIG. 2A, then current will start to flow through the inductor, reducing the A voltage and building up a magnetic flux on $L_1$. Eventually $C_1$ is discharged, and voltage across it reaches zero. But the current will continue to flow as shown in FIG. 2B, because the current through an inductor cannot change instantaneously. Now the voltage at node A is $V_{DD}$. The current starts to charge the capacitor in opposite polarity to its initial state. If N2 is ON just after the start of capacitor charging, the capacitor will directly connect to the ground and charge to $V_{DD}$ instantly. Once the magnetic field is completely dissipated, the current through the inductor will be zero as illustrated in FIG. 2C. The current will start to flow in the opposite direction through the inductor due to the voltage across it (presence of the charged capacitor in parallel). Since N2 is still ON, the current will be sourced by the input power source. This inductor current is stored as energy in form of magnetic field at $L_1$. Once N2 is off, $C_1$ starts to discharge through the $L_1$. When current through $L_1$ reaches its peak, $C_1$ is fully discharged as shown in FIG. 2D. Therefore, the inductor will store energy from $C_1$ capacitor and energy from input source ($V_{DD}$) simultaneously. At this instant, voltage at node A is $V_{DD}$. The zero voltage across the $C_1$ capacitor causes the current through $L_1$ to stop, but $L_1$ resists change in its current, so the reduction of current is gradual. Therefore, current will continue in the same direction, but will decrease as the $L_1$ magnetic flux discharges through the $C_1$ capacitor. This inductor current will charge the $C_1$ capacitor to $\sim 2V_{DD}$, which will result in $\sim 3V_{DD}$ at node A as illustrated in FIG. 2E. Then the cycle will begin again, with the reverse current through the inductor.

Figure 4A:
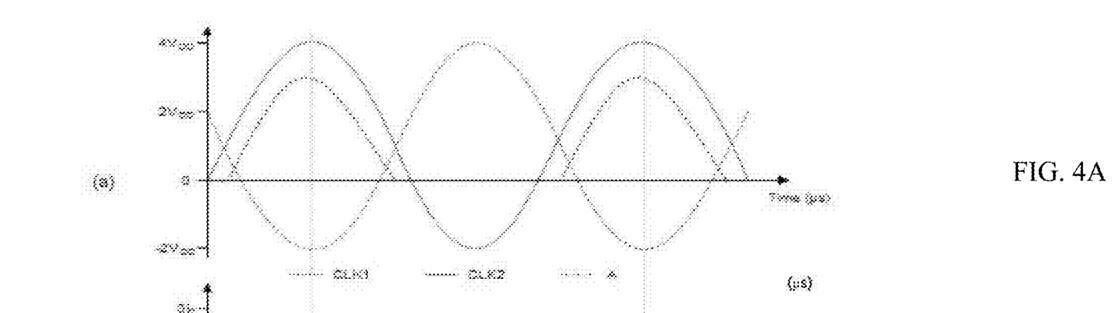
FIGS. 4A-4C show characteristic curves relating to the LC tank which quadruples the voltage.
Figure 4B:
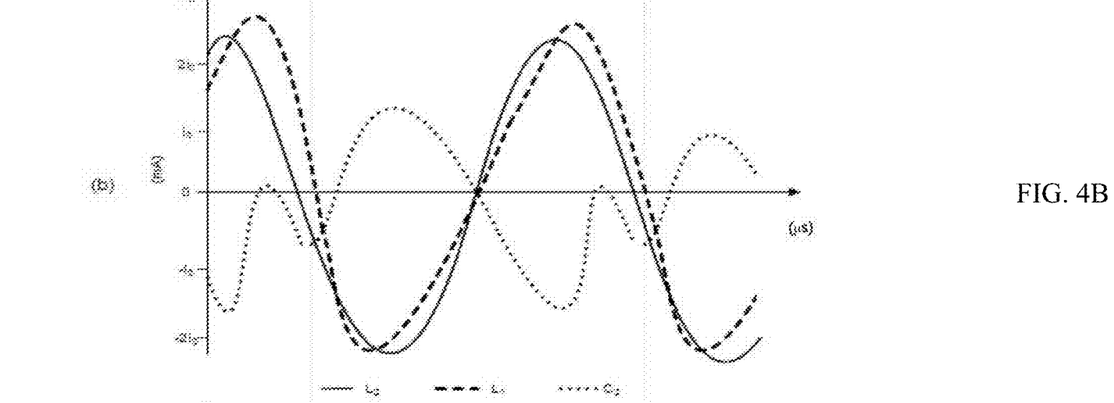
Figure 4C:
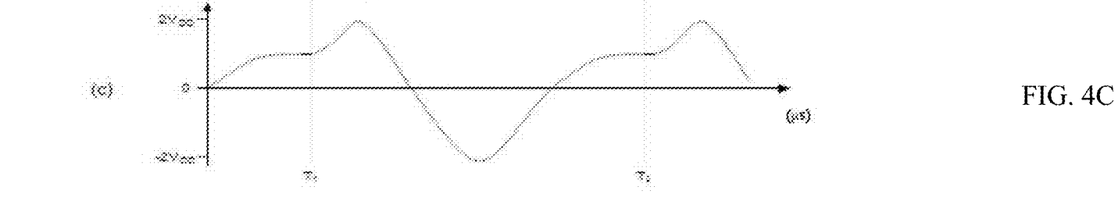

The secondary LC tank half circuit model analysis is shown in FIG. 3. Since CLK1 (oscillator output node) and node A has different zero-crossing as illustrated in FIG. 4A, the peak current through the $L_2$ inductor does not coincide with the $L_1$ peak current, as depicted in FIG. 4B. The current from N2 drain to primary LC tank inductor is assumed negative in the figure, while current from N2 drain to $C_2$ and $L_2$ is positive. The $L_2$ peak current is synchronized with the $C_2$ peak current, but is opposite in direction as illustrated in FIG. 4A. The zero voltage across the capacitor $C_2$ due to fully discharged state causes it to start charging. At this instant voltage levels at nodes A and CLK1 are equal (ground). The simultaneous zero current through $L_2$ and $C_2$ results in minimum voltage at the output. Once, N2 is off and $C_L$, $C_2$ are fully charged as shown in FIG. 3A, voltage at node A<CLK1. Then $C_2$ and $C_L$ will discharge through $L_2$ and $R_L$, while accumulating magnetic energy in $L_2$. Since $C_2$ is discharging, this current will not flow into the primary LC tank. The fully discharged $C_2$ and $C_L$ conduct the maximum $L_2$ current by delivering zero voltage at node A and CLK1 as in FIG. 3B. Then $L_2$ starts to contribute to the current in the same direction, and starts to charge the capacitors. Since N2 is switched on, some portion of the current flows through NMOS, and sinks to the ground. Finally, capacitors charge as shown in FIG. 3C, and create the minimum voltage at CLK1 ($\leq -2V_{DD}$). Then $C_2$ starts to discharge through $L_2$ inductor while $C_L$ is charging as shown in FIG. 3D. Simultaneously, since the primary LC tank capacitor is fully charged, $L_1$ inductor current is flowing through $L_2$ due to the negative voltage at CLK1 with respect to the ground connection at NMOS drain. The fully discharged $C_L$ and $C_2$ stop the current loop while the grounded voltage at node A is conveyed to CLK1. Since the inductor resists change in current, $L_2$ starts to discharge the magnetic energy by producing current in the same direction. This current will start to charge the capacitors, but the current through $C_2$ capacitor will sink to ground due to N2 ON condition (A=0V) as shown in FIG. 3D. Once voltage increases at CLK1, the majority of current starts to flow through the load and $C_2$ current will reduce with switched off N2 as shown in FIG. 3E. Therefore, $C_L$ current will be maximum and will increase CLK1 voltage. The increase in CLK1 voltage with respect to node A decreases the $C_L$ current and allows increase of $C_2$ current in the same direction again. Once $C_L$ is fully charged ($C_L$ current is zero), the voltage at CLK1 is at maximum as shown in FIG. 3F with secondary peak current through the $C_2$ as illustrated in FIG. 4B. Then $C_L$ and $C_2$ start to discharge through $L_2$ inductor while reducing the voltage at CLK1. This loop will continue until disconnection at the external power source ($V_{DD}$). The voltage across $C_2$ capacitor varies from $-2V_{DD}$ to $2V_{DD}$ with respect to node A as shown in FIG. 4C. When CLK1 voltage peaks, $C_2$ voltage is $\leq 2V_{DD}$ and $\geq V_{DD}$ according to $C_2$ capacitance. Higher $C_2$ capacitance will produce higher CLK1 voltage due to lower $C_2$ impedance and higher time constant. On the other hand, increase in $C_L$ causes reduction in the peak CLK1 voltage, resulting in reduction in the current passing through $C_2$.

Low phase noise is one of the main criteria for an oscillator design in several low power applications such as wireless and wired communication, charge pump clock signals, data converters and sensors. The low noise oscillator is an advantage for any kind of clocked system in terms of performance. A general definition relating to the phase noise of an oscillator is provided with the Leeson formula according to equation (1):

$$L(\Delta\omega) = 10\log\left\{\frac{2FkT}{P_{sig}}\left(1 + \left(\frac{\omega_0}{2Q\Delta\omega}\right)^2\right)\right\}, \quad (1)$$

wherein (T) is heat by Kelvin, ($\omega_0$) is oscillation frequency, (Q) is tank quality factor, (AU)) is the offset from the carrier, (Psig) is the signal power, (F) is a constant (noise factor) and (k) is the Boltzmann constant. In the present invention the described oscillator, has low phase noise even under low load resistance due to the high output amplitude which causes high signal power. For example, an embodiment of the circuit described, provides −180 dBc/Hz phase noise at a frequency offset of 1-MHz in relation to the 2 kΩ ($R_L$) and 10 pF ($C_L$) parallel RC load at the 0.2 V DC input.

The present invention provides a VCO implementation which is suitable for low voltage and low power operation. The performance of the oscillator has been significantly improved in terms of input voltage, voltage amplitude gain, low phase noise, oscillation purity and high output power capacity by the addition of a secondary LC tank to the primary LC tank. Therefore, the implemented design improves the performance of applications such as low noise energy transfer, quality frequency synthesis, improved phase lock loop and low voltage energy harvesting. An implementation of the LC tank in 180 nm CMOS technology can self-start with input voltage as low as 0.09 V to successfully sustain the oscillations with an amplitude of 0.36 V. The LC tank which quadruples the applied voltage, is suitable for generating sinusoidal signals from input voltages even lower than the MOSFET threshold voltage in a given technology.

The present invention shall be understood more clearly form the features described below.

The present invention comprises a cross connected MOSFET (NMOS) pair as a negative resistance generator. The LC tank oscillator which quadruples the voltage has high output voltage and low input operation voltage, and as a result it allows operation at very low voltages in the present invention. Additionally, the output node (secondary LC tank output) has full sinusoidal wave oscillation, whereas the primary LC tank, has a half wave oscillation due to the ground connected NMOS. Another important feature of the present invention is the fully integrated LC tank which quadruples the voltage and has an oscillation ability at <1 GHz oscillation frequency. The primary and the secondary oscillators of the LC tank which quadruple voltage are in series once the corresponding MOSFET is switched off. By this means the LC tank based oscillator which quadruples the voltage has higher oscillation amplitude for a given ultra low input voltage. Moreover, the LC tank oscillator which quadruples the voltage, has a minimum number of circuit components (active and passive) in order to meet the fully integrated primary and secondary oscillator requirements in the present invention in relation to low cost and low profile systems. The minimization of active components reduces the phase noise of the oscillator which quadruples voltage in very low voltage applications. The secondary LC tank of voltage quadrupling oscillator is formed between the gate of one NMOS and the drain of the other NMOS, the differential outputs of the voltage quadrupling LC tank is connected to the gate terminals of the active NMOS devices. The circuit does not need any external voltage other than the input voltage. It means that the secondary LC tank of voltage quadrupling oscillator does not need a separate power source. The primary LC tank is in series with the secondary LC tank at the peak amplitude of the output node of voltage quadrupling LC tank. In this way, voltage quadrupling LC tank has a higher voltage gain.

A fully integrated oscillator for ultra low voltage applications which quadruples voltage and has low phase comprises:

- A self-starting oscillator circuit that has a primary LC tank pair, a secondary LC tank pair and a switch pair in order to provide negative resistance for forming a differential sinusoidal AC pair, in other words frequency having a 180° phase offset and to form a fixed amplitude of two output signals.
- A primary LC tank circuit that consists of one inductor and one capacitor in parallel to the inductor. One of the primary LC tank pair is connected between the first switch and input supply, and the second of the primary LC tank pair is connected between the second switch and input supply. In such an embodiment, there are thus two inductors and two capacitors in the primary LC tank circuit.
- According to another embodiment of the primary LC tank circuit, a capacitor is provided which is connected to the switch part of the LC tank and which is known as the bypass capacitor. The bypass capacitor can be used to change the output signal frequency and amplitude.
- According to an embodiment which has been specifically designed for integrated, low cost systems, the primary LC tank capacitors are provided via the parasitic (intrinsic) capacitances of peripheral circuits such as the capacitance of the node which connects to the secondary oscillator. In such an embodiment, a certain primary capacitor is not required.
- Two active circuit components serving as a switch pair to provide negative resistance in order to maintain constant oscillation amplitude and frequency. Each switch in the pair is connected to one of the primary LC tank circuits.
- In one embodiment, each switch can be implemented with one N-channel MOSFET. In other embodiments, other controlled switching devices can be used.
- A secondary LC tank formed of an inductor and a capacitor parallel to the inductor. A part of the secondary LC tank is connected between the primary MOSFET drain and the secondary MOSFET gate. Another part of the secondary LC tank is connected between the secondary MOSFET drain and the primary MOSFET gate.

According to such an embodiment two inductors and two capacitors are provided in the secondary LC tank circuit.

Signals having different duty cycles which are automatically created are used in the gate and drain terminals of MOSFET's and they enable to close and open the NMOS switches completely and they contribute to the suitable switching mechanism of the oscillator in order to improve oscillation purity and reduce phase noise.

TABLE 1

Performance comparison tables of some VCO's implemented in the recent years in relation to low voltage applications.

| Ref. | $f_0$ (GHZ) | $V_{in}$ (V) | Voltage gain | Power (mW) | Phase noise (dBc/Hz) @ 1 MHz | Tuning range (%) | Technology (nm) |
|---|---|---|---|---|---|---|---|
| [5] | 1.92 | 0.9 | — | 1.78 | −117.8 | 3.9 | 180 |
| [13] | 3.3 | 2.7 | — | 80 | −137.1 | 14 | — |
| [14] | 5.6 | 0.6 | <3 | 3 | −118 | 8.1 | 180 |
| [18] | 6.2 | 1.6 | <1 | 4.9 | −119.4 | 16.2 | 180 |
| [19] | 12 | 1.1 | <1 | 1.0 | −105.3 | 29.7 | 65 |
| [20] | 12.4 | 0.45 | — | 0.96 | −116.4 | 7.9 | 130 |
| [21] | 1.6 | 1.8 | — | 2.7 | −121 | 31 | 180 |
| This work | 0.17 | 0.2 | | 1.6 | −180 | 20 | 180 |

REFERENCES

[1] K. Kwok and H. C. Luong, "Ultra-low-Voltage high-performance CMOS VCOs using transformer feedback," IEEE J. Solid-State Circuits, vol. 40, no. 3, pp. 652-660, March 2005.

[2] Young Jae Lee, Cheon Soo Kim, "Differential VCO and quadrature VCO using center-tapped cross-coupling of transformer," U.S. Pat. No. 8,212,625 B2, 3 Jul. 2012.

[3] B.-E. Seow, T.-H. Huang, C.-Y. Wu, P.-Y. Pao, and H.-R. Chuang, "A Low-Voltage 30-GHz CMOS Divide-by-Three ILFD With Injection-Switched Cross-Coupled Pair Technique," IEEE Trans. Microw. Theory Tech., pp. 1-9, 2017.

[4] M. Tiebout, "Low-power low-phase-noise differentially tuned quadrature VCO design in standard CMOS," IEEE J. Solid-State Circuits, vol. 36, no. 7, pp. 1018-1024, July 2001.

[5] Wen-Cheng Lai, Sheng-Lyang Jang, Jheng-Wei Jhuang, Shyh-Shyang Su, and Ching-Wen Hsue, "Low power consumptions voltage control oscillator uses PMOS elements optical sensor application," 2016, pp. 1-4.

[6] S.-L. Jang, Y.-K. Wu, C.-C. Liu, and J.-F. Huang, "A Dual-Band CMOS Voltage-Controlled Oscillator Implemented With Dual-Resonance LC Tank," IEEE Microw. Wirel. Compon. Lett., vol. 19, no. 12, pp. 816-818, December 2009.

[7] S. Ikeda, S. yeop Lee, H. Ito, N. Ishihara, and K. Masu, "A 0.5 V 5.96-GHz PLL With Amplitude-Regulated Current-Reuse VCO," IEEE Microw. Wirel. Compon. Lett., vol. 27, no. 3, pp. 302-304, March 2017.

[8] Huijung Kim, Seonghan Ryu, Yujin Chung, Jinsung Choi, and Bumman Kim, "A low phase-noise CMOS VCO with harmonic tuned LC tank," IEEE Trans. Microw. Theory Tech., vol. 54, no. 7, pp. 2917-2924, July 2006.

[9] Frank Gelhausen, Karlheinz Muth, "CMOS LC-tank oscillator," U.S. Pat. No. 7,256,660 B2, 14 Aug. 2007.

[10] John William Mitchell Rogers; Calvin Plett, "Low voltage voltage-controlled oscillator topology," U.S. Pat. No. 6,469,586 B1, 22 Oct. 200AD.

[11] Ulrich L. Rohde, Reimund Rebel, Ajay Kumar Poddar, "Wideband voltage controlled oscillator employing evanescent mode coupled-resonators," U.S. Pat. No. 7,180,381 B2, 20 Feb. 2007.

[12] Ram Singh Rana, Zhou Xiangdong, Lian Yong, "Low supply-sensitive and wide tuning-range CMOS LC-tank voltage-controlled oscillator monolithic integrated circuit," U.S. Pat. No. 7,075,379 B2, 11 Jul. 2006.

[13] Hyman Shanan and Franklin Park, "Oscillator with primary and secondary LC circuits," U.S. Pat. No. 9,214,895 B2, 15 Dec. 2015.

[14] H.-H. Hsieh and L.-H. Lu, "A High-Performance CMOS Voltage-Controlled Oscillator for Ultra-Low-Voltage Operations," IEEE Trans. Microw. Theory Tech., vol. 55, no. 3, pp. 467-473, March 2007.

[15] Ho-Jun Chang, Changwoo Lim, and Tae-Yeoul Yun, "CMOS QVCO With Current-Reuse, Bottom-Series Coupling, and Forward Body Biasing Techniques," IEEE Microw. Wirel. Compon. Lett., vol. 24, no. 9, pp. 608-610, September 2014.

[16] L. Geynet, E. De Foucauld, P. Vincent, and G. Jacquemod, "Fully-Integrated Multi-Standard VCOs with switched LC tank and Power Controlled by Body Voltage in 130 nm CMOS/SOI," 2006, pp. 109-112.

[17] Wang Xudong, Wang Xiaodong, "Cross-coupled voltage controlled oscillator with improved phase noise performance," U.S. Pat. No. 6,680,657, 20 Jan. 2004.

[18] K.-W. Kim, H.-J. Chang, Y.-M. Kim, and T.-Y. Yun, "A 5.8 GHz Low-Phase-Noise LC-QVCO Using Splitting Switched Biasing Technique," IEEE Microw. Wirel. Compon. Lett., vol. 20, no. 6, pp. 337-339, June 2010.

[19] A. G. Amer, S. A. Ibrahim, and H. F. Ragai, "A 1-mW 12-GHz LC VCO in 65-nm CMOS technology," 2016, pp. 456-459.

[20] G.-S. Byun and M. Jalalifar, "Design of Ku-band transformer-based cross-coupled complementary LC-VCO," Electron. Lett., vol. 51, no. 11, pp. 832-834, May 2015.

[21] H.-L. Cai et al., "A 2.7-mW 1.36& #x2013; 1.86-GHz LC-VCO With a FOM of 202 dBc/Hz Enabled by a 26%-Size-Reduced Nano-Particle-Magnetic-Enhanced Inductor," IEEE Trans. Microw. Theory Tech., vol. 62, no. 5, pp. 1221-1228, May 2014.

What is claimed is:

1. A fully integrated oscillator for ultra low voltage applications, wherein the fully integrated oscillator comprises a primary LC tank pair, a secondary LC tank pair, and a switch pair, wherein:
the primary LC tank pair comprises a first primary LC tank and a second primary LC tank, wherein each of the first primary LC tank and the second primary LC tank comprises a primary tank circuit, wherein the primary LC tank pair has a differential sinusoidal AC signal pair, wherein the primary tank circuit is formed of a primary inductor and a primary capacitor parallel to the primary inductor in order to provide negative resistance for the primary LC tank pair to create two output signals having a fixed oscillation amplitude and a frequency with 180° phase deviation; wherein
the first primary LC tank of the primary LC tank pair is connected between a primary switch and an input supply and the second primary LC tank is connected between a second switch and the input supply;

a bypass capacitor is connected between the primary switch and the second switch of the primary LC tank pair, the bypass capacitor changes an output signal frequency and amplitude of the primary LC tank pair, and the bypass capacitor has half wave oscillations due to an NMOS and the NMOS is earthed;

the secondary LC tank pair comprises a first secondary LC tank and a second secondary LC tank, wherein each of the first secondary LC tank and the second secondary LC tank comprises a secondary tank circuit, wherein the secondary tank circuit is formed of a secondary inductor and a secondary capacitor parallel to the secondary inductor, wherein a first secondary LC tank is connected between a drain of a first NMOS and a gate of a second NMOS, and a second secondary LC tank is connected between a drain of the second NMOS and a gate of the first NMOS;

the secondary LC tank pair comprises two second inductors and two second capacitors, wherein an output voltage of the secondary LC tank pair is operated as a NMOS switch gate voltage in order to control an oscillator operation, wherein the output voltage of the secondary LC tank pair cooperates with the primary LC tank pair, wherein an output formed between a gate of the NMOS and a drain of the NMOS is a parallel combination of the secondary capacitor and the secondary inductor to form full sinusoidal wave oscillations, and the full sinusoidal wave oscillations increase an amplitude of the output voltage to be four times of an amplitude of an input voltage, and increase an output power capacity and reduce a phase noise, each of the switch pair is connected to the primary tank circuit of each one of the primary LC tank pair in order to provide negative resistance to protect the fixed oscillation amplitude and the frequency, and each of the switch pair is implemented with each of the first NMOS and the second NMOS, and the switch pair further comprises controlled switching devices;

wherein the primary capacitor is provided via parasitic capacitances of peripheral circuits, wherein the parasitic capacitances comprise a capacitance of a node connecting the primary tank circuit to the secondary tank circuit.

2. The fully integrated oscillator according to claim 1, wherein the primary tank circuit is serially connected to the secondary tank circuit at a peak amplitude of an output node of the primary tank circuit to quadruple the input voltage.

3. The fully integrated oscillator according to claim 1, wherein the NMOS is formed of a cross connected NMOS pair acting as a negative resistance generator.

4. The fully integrated oscillator according to claim 3, wherein the cross connects the switch pair, controls the primary LC tank pair and the secondary LC tank pair, wherein the primary LC tank pair and the secondary LC tank pair operate synchronously.

5. The fully integrated oscillator according to claim 1, wherein the switch pair has high voltage switching control, completely closes the NMOS by using a negative peak point of the secondary LC tank pair, and reduces leakage in order to reduce power losses and improve oscillation performance.

6. The fully integrated oscillator according to claim 1, wherein the primary LC tank pair and the secondary tank pair each has at least two active components, wherein the active components are control switches used together with the NMOS.

7. The fully integrated oscillator according to claim 1, wherein the primary LC tank pair and the secondary tank pair each has at least two active components, wherein the active components comprises at least two of the primary inductor related with the primary LC tank pair and a capacitor-inductor pair related to each of the secondary LC tank pair and wherein additional components of the active components are used in order to change frequency and amplitude characteristics of the fully integrated oscillator.

8. The fully integrated oscillator according to claim 1, wherein the output of the secondary LC tank pair is connected to an active NMOS device gate terminal.

9. The fully integrated oscillator according to claim 1, wherein an oscillation frequency ability of the fully integrated oscillator is less than 1 GHz.

10. The fully integrated oscillator according to claim 1, wherein the primary LC tank pair and the secondary LC tank pair are serially connected, and the input voltage is quadrupled following a switching off of a corresponding NMOS of the fully integrated oscillator.

11. The fully integrated oscillator according to claim 1, wherein the fully integrated oscillator has only one power supply from the input supply.

12. The fully integrated oscillator according to claim 1, wherein the primary inductor and switches for the primary capacitor are changed with the parasitic capacitances in integrated designs.

13. The fully integrated oscillator according to claim 1, wherein the fully integrated oscillator comprises two NMOSs.

14. The fully integrated oscillator according to claim 1, wherein the fully integrated oscillator is implemented in a 180 nm CMOS technology, wherein the fully integrated oscillator operates automatically with a low input voltage as low as 0.09 V in order to sustain oscillations having amplitudes of 0.36 V.

* * * * *